(12) United States Patent
Wong et al.

(10) Patent No.: US 6,563,213 B1
(45) Date of Patent: May 13, 2003

(54) INTEGRATED CIRCUIT HEAT SINK SUPPORT AND RETENTION MECHANISM

(75) Inventors: Thomas Wong, Seattle, WA (US); Neal Ulen, Lacey, WA (US); Peter Davison, Puyallup, WA (US); Ketan Shah, Tumwater, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/419,964

(22) Filed: Oct. 18, 1999

(51) Int. Cl.[7] .............................. H05K 7/20; H05K 9/00; H05K 7/02; H05K 3/30
(52) U.S. Cl. ..................... 257/727; 257/726; 257/718; 257/719; 257/712; 257/713; 257/706; 257/731; 257/729; 361/700; 361/704; 361/386; 361/720; 361/709; 361/710; 439/748; 439/866; 332/271
(58) Field of Search ................. 257/785, 706, 257/712, 713, 718, 726, 727, 732, 731, 719; 337/271; 439/748, 866; 361/706, 386, 704, 720, 709, 710

(56) References Cited

U.S. PATENT DOCUMENTS

| | | | | |
|---|---|---|---|---|
| 4,396,935 A | * | 8/1983 | Schuck | |
| 5,208,731 A | * | 5/1993 | Blomquist | 257/718 |
| 5,241,453 A | | 8/1993 | Bright et al. | 361/704 |
| 5,280,409 A | * | 1/1994 | Selna et al. | 257/706 |
| 5,329,426 A | * | 7/1994 | Villani | 257/719 |
| 5,436,798 A | | 7/1995 | Wieland, Jr. | 361/710 |
| 5,586,005 A | * | 12/1996 | Cipolla et al. | 257/719 |
| 5,825,622 A | * | 10/1998 | Rife et al. | 257/718 |
| 5,870,285 A | | 2/1999 | Kosteva et al. | 361/704 |
| 5,889,653 A | * | 3/1999 | Clemens et al. | 257/727 |
| 5,898,575 A | * | 4/1999 | Hawthorne et al. | 257/686 |
| 5,917,703 A | * | 6/1999 | Murphy | 257/719 |
| 5,926,371 A | | 7/1999 | Dolbear | 361/704 |
| 5,933,326 A | * | 8/1999 | Lee et al. | 257/713 |
| 6,007,357 A | * | 12/1999 | Perino et al. | 439/327 |
| 6,021,044 A | * | 2/2000 | Neville, Jr. et al. | 361/700 |
| 6,205,026 B1 | | 3/2001 | Wong et al. | 361/704 |
| 6,219,241 B1 | * | 4/2001 | Jones | 361/704 |
| 6,222,379 B1 | * | 4/2001 | Farnsworth et al. | 324/755 |
| 6,226,185 B1 | * | 5/2001 | Lin | 257/719 |
| 6,243,267 B1 | * | 5/2001 | Chuang | 361/704 |
| 6,243,265 B1 | | 6/2001 | Wong et al. | 361/704 |
| 6,256,202 B1 | * | 7/2001 | Murphy | 257/719 |
| 6,307,747 B1 | * | 10/2001 | Farnsworth et al. | 257/719 |
| 6,310,773 B1 | | 10/2001 | Yusuf et al. | 361/704 |
| 6,311,765 B1 | | 11/2001 | Lo et al. | 165/80.3 |
| 6,349,032 B1 | * | 2/2002 | Chan et al. | 257/718 |

* cited by examiner

*Primary Examiner*—Alexander O. Williams
(74) *Attorney, Agent, or Firm*—Schwegman, Lundberg, Woessner & Kluth, P.A.

(57) ABSTRACT

The present invention provides an improved heat sink retention assembly, such that the heat sink is physically supported by a base rather than by an integrated circuit. Traditional heat sinks have an alignment feature that physically aligns and supports the heat sink by contact of the feature with an integrated circuit, and that transfers force applied to the heat sink to the integrated circuit. This transferred force may be seen as shear stress at the pins of integrated circuits such as pin-grid arrays, and may damage the integrity of the integrated circuit or its connection to an external circuit. The present invention provides alignment and support features remote from contact with the integrated circuit, and therefore provides support for the heat sink in a manner that does not place substantial stress on the integrated circuit.

13 Claims, 4 Drawing Sheets

INTEGRATED CIRCUIT HEAT SINK SUPPORT AND RETENTION MECHANISM

FIELD OF THE INVENTION

The invention relates generally to the mechanics of integrated circuit heat sinks, and more specifically to a heat sink mounting mechanism.

BACKGROUND OF THE INVENTION

Integrated circuits that perform complex tasks or deal with large volumes of data, such as modern microprocessors and digital signal processors, often require as many as several hundred electrical connections to external circuitry. These connections may include interfaces to system memory, cache, system buses, and a variety of other control or support circuitry. Packaging integrated circuits such that they can be easily and reliably connected to an external circuit requires a mechanism capable of making this large number of required electrical connections in a manner that is secure and electrically reliable. Furthermore, the large amount of heat produced by many such integrated circuits must be dissipated, and therefore must be accounted for in designing the integrated circuit mounting and packaging systems.

One solution to the demand for a large number of interconnects is the Pin-Grid Array (PGA), which is an array of pins spaced closely together extending from a surface of an integrated circuit package. The pins are spaced in a predetermined and standardized way such that they will correspond to sockets that have been designed to be compatible with the selected pin configuration. PGA integrated circuits are currently available with up to several hundred pins on a single package, and are therefore widely used in industry for applications such as processor packaging.

To dissipate heat generated by the PGA integrated circuit, a heat sink is often applied to the side of the integrated circuit opposite the side from which the electrical pin connections are mounted, such that the heat sink is oriented extending away from the printed circuit board to which the integrated circuit is mounted. Such heat sinks are often connected to the integrated circuit package by means of a spring clip, a bar clip, or other clip mechanism that secures the heat sink on top of and in secure physical contact with the integrated circuit. In some applications, a thermally conductive material is applied between the surfaces of the heat sink and the integrated circuit, to further ensure a good thermal connection between the two devices. Such mounting mechanisms have proven effective for mounting heat sinks to many devices, in part because the low mass of the heat sinks used has allowed use of clips and other retention mechanisms that produced little physical force on the integrated circuit.

But, as integrated circuits increase in complexity, they become more difficult to mount and heat sink adequately. Faster integrated circuits with more dense internal circuitry produce more heat over a given physical area than previous generations of integrated circuits. Also, the greater amount of circuitry on more dense integrated circuits may require heat sinks that are physically larger than the top surface of the integrated circuit, or that have other larger or more complex geometries.

Large heat sinks capable of dissipating many tens of watts of power converted to heat by such integrated circuits may cause unacceptable forces on the integrated circuits when mounted directly to the integrated circuit package. For example, such systems may be required to withstand physical shock of up to 50 g, or 50 times the acceleration of gravity, without undue physical stress. When this type of physical shock is applied to a processor with a very heavy heat sink attached to it, the weight of the heat sink can cause undue stress on the electrical connection pins of the integrated circuit, such as shear stress. Also, the clips used to hold the heat sink on to the integrated circuit may not be able to retain a very heavy heat sink under such heavy acceleration, and so may fail to acceptably secure heavy heat sinks.

Therefore, a device is needed to better support heavy heat sinks as applied to integrated circuitry such as a PGA mounted integrated circuit. Such a device should transfer the forces presented by the heavy heat sink under heavy acceleration away from the integrated circuit and onto a supporting structure such as a motherboard or securely mounted integrated circuit socket.

SUMMARY OF THE INVENTION

A heat sink assembly is provided that has a heat sink alignment feature located thereon and that is remote from an integrated circuit contact area of the heat sink. A heat sink support supports and aligns the heat sink in contact with the integrated circuit and mates with the heat sink alignment feature of the heat sink. The heat sink support is mounted to a base, such that force applied to the heat sink is transferred to the heat sink support and to the base.

DETAILED DESCRIPTION

In the following detailed description of sample embodiments of the invention, reference is made to the accompanying drawings which form a part hereof, and in which is shown by way of illustration specific sample embodiments in which the invention may be practiced. These embodiments are described in sufficient detail to enable those skilled in the art to practice the invention, and it is to be understood that other embodiments may be utilized and that logical, mechanical, electrical, and other changes may be made without departing from the spirit or scope of the present invention. The following detailed description is, therefore, not to be taken in a limiting sense, and the scope of the invention is defined only by the appended claims.

Because of the increased size and weight of heat sinks needed to dissipate the large amount of heat generated by integrated circuits as discussed above, a better method of mounting heat sinks to these integrated circuits is needed. Specifically, an apparatus is needed that provides for distributing the forces of a large heat sink under heavy acceleration to a mechanically stable mounting apparatus rather than to the pins of the integrated circuit. The present invention provides such an apparatus, and distributes these forces to the base of the integrated circuit mounting socket and to the motherboard.

The present invention provides a mounting apparatus for a heat sink, to be aligned with and supported in contact with an integrated circuit. The heat sink is mounted to and supported by an integrated circuit socket or other external retention mechanism, and is, positioned such that the heat sink is also in physical contact with the top surface of the integrated circuit. The heat sink support and heat sink are designed such that the support bears a substantial portion of the dynamic forces of the heat sink under acceleration or force, thereby protecting the integrated circuit from bearing these forces.

Figure 1:
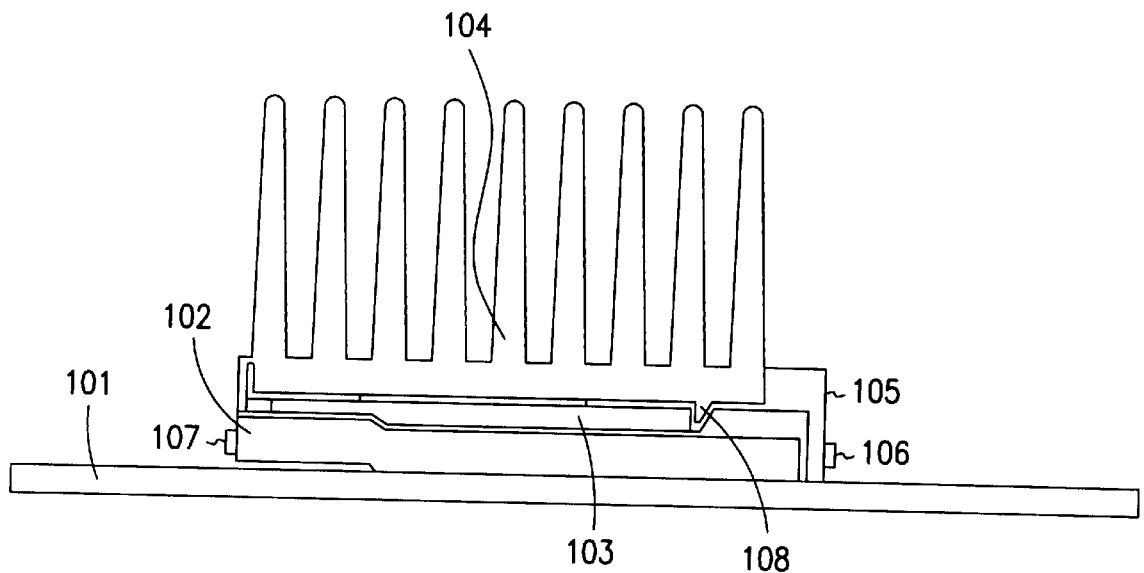
FIG. 1 shows an integrated circuit and socket with an attached heat sink, consistent with the prior art.

FIG. 1 shows a heat sink mounted to an integrated circuit and a socket in a manner that is typical of the prior art. A printed circuit board 101 has attached to it a socket 102, capable of receiving and electronically connecting with an integrated circuit. A heat sink 104 is attached to the integrated circuit 103 by a mounting clip 105. The clip 105 is attached to the socket by affixing the clip to tabs 106 and 107, and applies physical pressure to the heat sink 104, the integrated circuit 103 and the socket 102. The heat sink comprises in part one or more ridges 108 that align the heat ink 104 with the integrated circuit 103 when mounting the heat sink.

Figure 2:
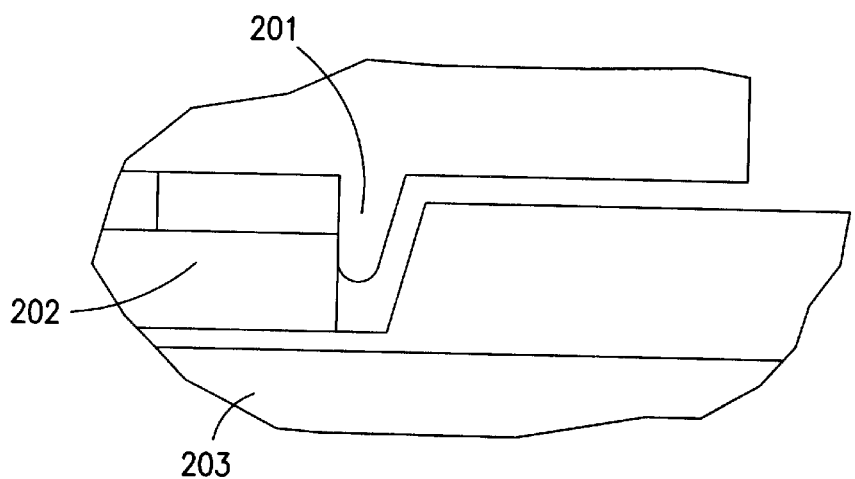
FIG. 2 shows a detailed view of a portion of the integrated circuit and heat sink assembly of FIG. 1, consistent with the prior art.

FIG. 2 shows an enlarged detail view of a ridge 201 that is representative of ridges 108. The ridge 201 here is in physical contact with the integrated circuit 202, and so both positions the heat sink 201 relative to integrated circuit 202 and physically couples the heat sink to the side of the integrated circuit. Because the heat sink is physically constrained by edges of the integrated circuit that are in contact with the heat sink or heat sink ridges 201, any forces applied to the heat sink will be transmitted to the integrated circuit 202. For example, when the heat sink undergoes heavy acceleration such as when a computer containing such an assembly is dropped, the force of the heat sink upon rapid deceleration while stopping is applied directly to the integrated circuit. This force may be borne as shear stress on the integrated circuit pins that connect the integrated circuit to the socket 203 in a device such as a PGA integrated circuit, and on the external body of the integrated circuit itself. As larger and heavier heat sinks become necessary to dissipate larger amounts of heat produced by advanced integrated circuits, these forces become unacceptably high, requiring a new means of mounting a heat sink to prevent transmission of such heavy forces to the integrated circuit.

Figure 3:
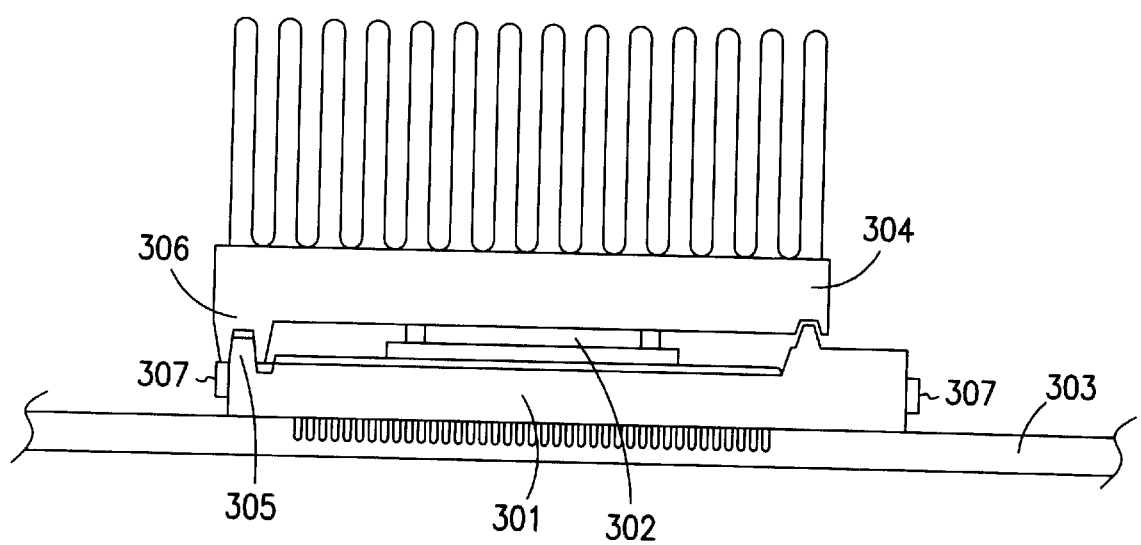
FIG. 3 shows a PGA integrated circuit mounted on an improved socket assembly with a heat sink attached thereto, consistent with an embodiment of the present invention.

FIG. 3 shows an embodiment of the invention that provides offloading of such forces from the heat sink directly to the socket, greatly reducing the stresses applied to the integrated circuit. A socket 301 receives the integrated circuit 302, and electrically and physically connects the integrated circuit to a printed circuit board 303. A heat sink 304 is mounted in contact with the top surface of the integrated circuit 302, and provides thermal cooling to the integrated circuit. The socket 301 has one or more ridges such as ridge 305, designed to support the heat sink 304. The heat sink 304 has a corresponding slot 306 that mates with the socket ridge 305 upon mounting of the heat sink, such that the physical connection between the ridge 305 and the slot 306 physically positions and supports the load of the heat sink. The heat sink is again attached to the socket by a clip, which extends over the heat sink and is attached to tabs 307.

Such an apparatus must be designed with a specific geometry, so that the heat sink 304 contacts the integrated circuit 302 when it is supported by the socket such as by ridge 305 and slot 306. Although the socket 301 supports the heat sink 304 in this embodiment, the heat sink 304 must remain in physical contact with the integrated circuit 302 to provide the intended cooling effect. Thermally conductive material may be applied between the heat sink 304 and the integrated circuit 302 to fill any voids and allow less strict tolerances in designing the assembly. But, even use of a thermally conductive paste cannot compensate for large variations in assembly geometry, and a design such as this embodiment of the invention must be designed so that the heat sink contacts both the integrated circuit and is supported by the socket.

In another embodiment of the invention, a heat sink retention mechanism allows use of a standard socket, and also supports the heat sink in a manner that does not apply stress to the integrated circuit when the heat sink is under force. A standard socket 401 is provided, that is capable of receiving an integrated circuit 402. The socket electronically and physically connects the integrated circuit to a printed circuit board 403. A heat sink 404 is positioned in physical contact with the integrated circuit 402, and provides cooling to the integrated circuit by dissipating heat. A retention mechanism comprising elements 405 and 406 is mounted on the printed circuit board 403 in a position adjacent to the socket 401, and is securely mechanically fixed to the printed circuit board.

After the integrated circuit 402 has been mounted in the socket 401 and the retention mechanism 405 and 406 is securely fixed to the printed circuit board 403, the heat sink 404 is mounted in contact with integrated circuit 402 and retained by retention mechanism 405. Force on the heat sink is therefore applied to the retention mechanism rather than to the integrated circuit, thereby reducing the shear stress on the pins of the integrated circuit and other potentially damaging forces. An external retention mechanism such as in this embodiment is advantageous in that it can support very large heat sinks, because the size of the heat sink need not correspond to the integrated circuit or its socket, but is supported instead by an external retention mechanism.

In one further embodiment of this invention, the retention mechanism 405 and 406 is affixed to the printed circuit board by mounting pins 407 that interface with mounting holes 408 in the printed circuit board. The retention mechanism also comprises one or more attachment mechanisms such as clips 409. The heat sink is attached to the retention mechanism by attachment mechanisms 409, and is physically supported by the retention mechanism such that it is in contact with integrated circuit 402. The components of such an embodiment must be of a geometry that is specifically designed to support the heat sink such that it is in physical contact with the integrated circuit, ensuring efficient transfer of thermal energy from the integrated circuit to the heat sink. Thermally conductive material commonly known as heat sink grease may again be applied to the interface between the heat sink 404 and the integrated circuit to provide a more thermally efficient connection, but cannot compensate for large variances in geometry of the components of such an embodiment.

Figure 4:
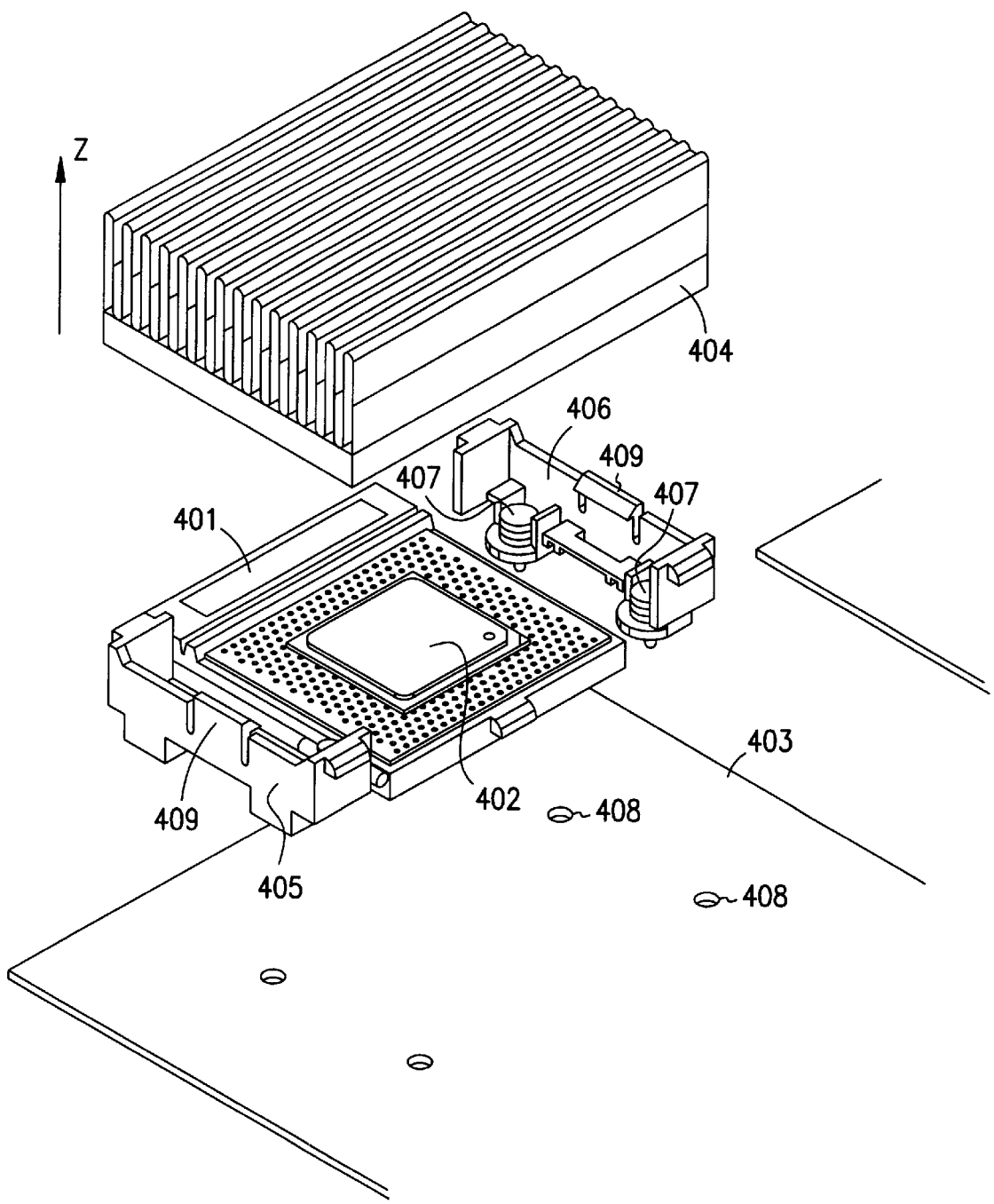
FIG. 4 shows an integrated circuit and socket with adjacent retention mechanism elements that support and align a heat sink, consistent with an embodiment of the present invention.
Figure 5:
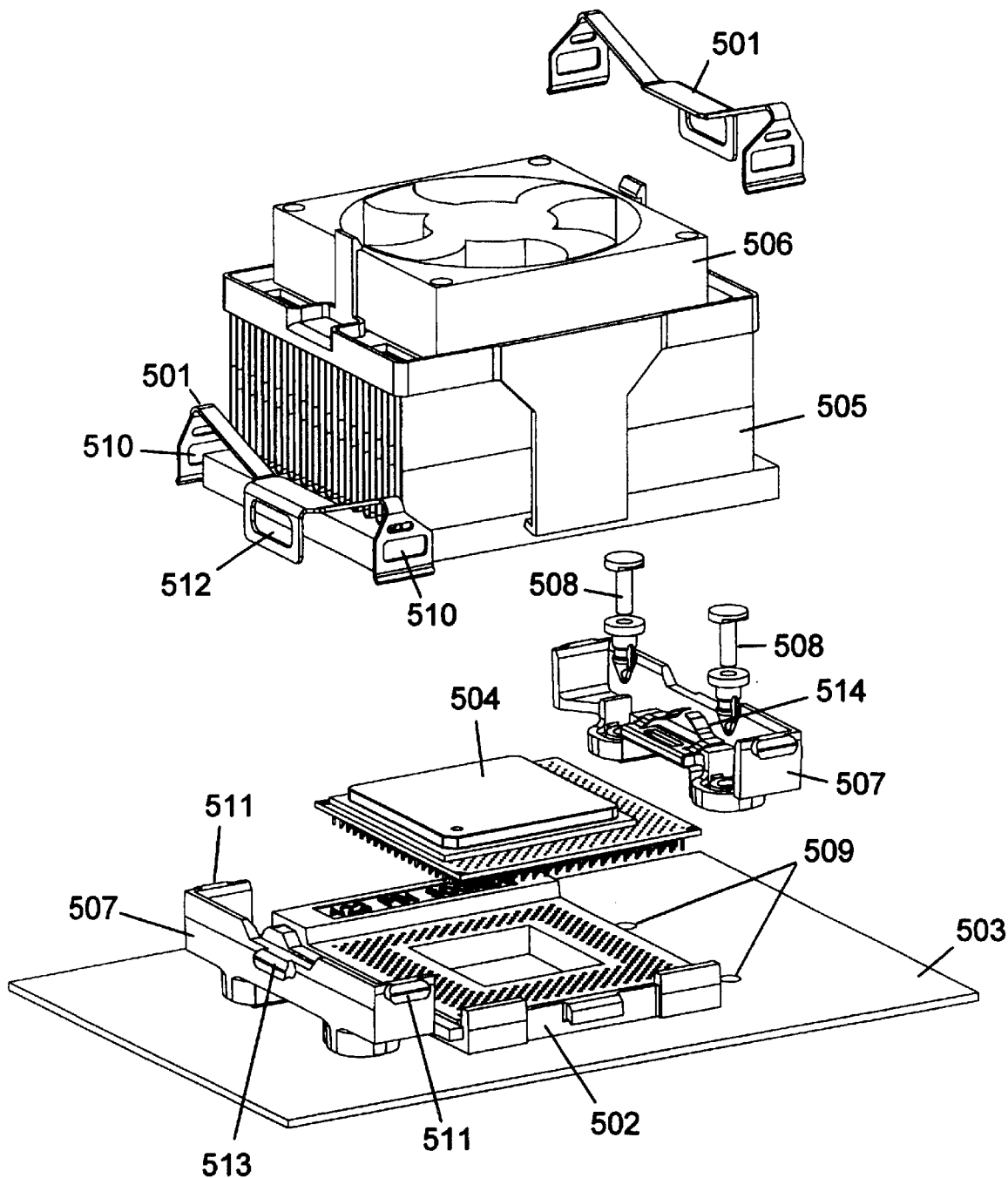
FIG. 5 shows an integrated circuit and socket with retention mechanism elements that support and align a heat sink and that further incorporates heat sink retention clips and retention mechanism springs, consistent with an embodiment of the present invention.

FIG. 5 illustrates an alternate embodiment of the invention that allows use of a standard socket via a retention mechanism as in FIG. 4, but further incorporates flexible retention clips 501 to hold the heat sink in place. A standard integrated circuit socket 502 is electronically and physically connected to the circuit board 503. The socket receives an integrated circuit 504, and physically and electrically connects the integrated circuit to the circuit board 503. A heat sink 505 is positioned in physical contact with the integrated circuit 504, and in some embodiments further incorporates a fan 506 to provide forced air flow to further assist in cooling. Retention mechanism elements 507 are physically mounted to the circuit board 503 in a position adjacent to the socket 502 such that they can receive and hold the heat sink 505 in a proper position relative to the integrated circuit 504.

Mounting pins 508 affix the retention mechanism 507 to the circuit board 503 by mating with mounting holes 509 in the circuit board. Flexible retention clips 501 have openings 510 therein, which clip onto tabs 511 of the retention mechanism elements. The retention clips also have an opening 512 that captures but does not clip onto tab 513 of the retention mechanism elements, thereby limiting the displacement between the assembled heat sink 505 and integrated circuit 504 under shock or force.

The embodiment of FIG. 5 when assembled cradles the heat sink 505 in the retention mechanism elements 507 such that the flat bottom surface of the heat sink assembly contacts the flat top surface of the integrated circuit 504. Thermally conductive material such as heat sink grease may be applied to the contact surface to ensure an efficient thermal connection. A retention mechanism spring 514 in some embodiments further supports the heat sink, but does not exert sufficient pressure on the heat sink to prevent it from resting in contact with the integrated circuit.

Retention clips 501 hold the heat sink assembly in the retention mechanism elements when assembled, and provide a spring force that pushes the heat sink assembly into the retention mechanism elements. The retention clips further restrict the amount by which the heat sink assembly may move against the spring force provided by the clips via retention clip opening 512 and tab 513. The opening 512 is larger than the tab 513 and does not contact the tab, except to prevent further flexing of the flexible retention clip when the heat sink is under force and has flexed the retention clip far enough to reach a desired heat sink displacement limit. Therefore, the heat sink retention mechanism of FIG. 5 not only supports the heat sink in a way that does not transfer force from the heat sink to the integrated circuit, but provides spring loading of some heat sink forces to further reduce the force transferred to the circuit board or integrated circuit when the heat sink is under high acceleration, such as when dropped.

The example embodiments of FIGS. 3, 4 and 5 are examples of heat sink mounting mechanisms that support and position the heat sink in contact with the integrated circuit, but that do not transfer force from the heat sink to the integrated. circuit. The invention includes these examples and other embodiments with mating features on a heat sink or heat sink support such that a mating feature or combination of mating features supports and aligns the heat sink. The heat sink mating features improve upon the prior art alignment or mating features in that they do not contact or apply force to the integrated circuit, but are remote from the area at which the integrated circuit and heat sink are in contact. The invention offers an improvement over the prior art in that it provides mounting of a heat sink to cool an integrated circuit in such a manner that the integrated circuit does not bear substantial shear stress from the heat sink when a force on the heat sink causes the heat sink to apply force to its mounting, such as under heavy acceleration.

A variety of other embodiments of the invention exist, and need not specifically include a retention mechanism as shown in FIG. 4 or 5, or a ridge 305 and slot 306 as pictured in the embodiment shown in FIG. 3. It is specifically contemplated that other mechanisms exist that may satisfactorily support a heat sink and that physically couple the heat sink to a base such as a printed circuit board without physically coupling the heat sink to the integrated circuit. These embodiments of the invention improve over the prior art in that the heat sink of the embodiments does not apply substantial stress to the integrated circuit when under force.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the invention. It is intended that this invention be limited only by the claims, and the full scope of equivalents thereof.

We claim:

1. A heat sink assembly, comprising:
   a heat sink with a heat sink alignment feature located thereon remote from an integrated circuit package contact area such that the heat sink alignment feature does not contact the integrated circuit package;
   a heat sink support that supports and aligns said heat sink and that mates with the heat sink alignment feature of said heat sink when the heat sink and heat sink support are attached, the heat sink support further configured for attachment to a printed circuit board such that the heat sink when attached to the heat sink support does not contact the printed circuit board, and such that a force on the heat sink is transferred to the heat sink support and to the printed circuit board.

2. The heat sink assembly of claim 1, wherein the heat sink support is an integrated circuit socket.

3. The heat sink assembly of claim 2, wherein the integrated circuit socket comprises one or more mating features that mate with one or more mating features of the heat sink.

4. The heat sink assembly of claim 3, wherein the one or more mating features of the heat sink comprise slots.

5. The heat sink assembly of claim 3, wherein the one or more mating features of the integrated circuit socket comprise ridges.

6. The heat sink assembly of claim 2, wherein the heat sink is attached to the integrated circuit socket by one or more clips.

7. The heat sink assembly of claim 1, wherein the heat sink support is a retention mechanism mounted to the base adjacent to an integrated circuit socket.

8. The heat sink assembly of claim 7, wherein the retention mechanism comprises a plurality of retention mechanism elements that are mechanically fixed to the base and to which the heat sink is mechanically attachable.

9. The heat sink assembly of claim 8, wherein the heat sink is mechanically attached to the retention mechanism elements by flexible retention clips.

10. The heat sink assembly of claim 9, wherein the flexible retention clips have openings therein that are captured by and are larger than tabs on the retention mechanism elements, such that the tabs do not contact the flexible retention clips except when the flexible retention clips have flexed to a desired heat sink displacement limit.

11. The heat sink assembly of claim 7, wherein the retention mechanism comprises one or more springs that support and position the heat sink.

12. The heat sink assembly of claim 7, wherein the heat sink is mechanically attached to the retention mechanism elements by one or more clips.

13. The heat sink assembly of claim 7, wherein the retention mechanism comprises one or more mating features that mate with one or more corresponding mating features of the heat sink.

* * * * *